US012635263B2

(12) United States Patent
Borgers et al.

(10) Patent No.: US 12,635,263 B2
(45) Date of Patent: May 19, 2026

(54) TECHNICAL WEAVE FOR PHOTOVOLTAIC MODULES

(71) Applicants: IMEC VZW, Leuven (BE); UNIVERSITEIT HASSELT, Hasselt (BE)

(72) Inventors: Tom Borgers, Leuven (BE); Jonathan Govaerts, Leuven (BE)

(73) Assignees: IMEC VZW, Leuven (BE); UNIVERSITEIT HASSELT, Hasselt (BE)

( * ) Notice: Subject to any disclaimer, the term of this patent is extended or adjusted under 35 U.S.C. 154(b) by 7 days.

(21) Appl. No.: 18/882,961

(22) Filed: Sep. 12, 2024

(65) Prior Publication Data

US 2025/0098336 A1      Mar. 20, 2025

(30) Foreign Application Priority Data

Sep. 14, 2023     (EP) ..................................... 23197552

(51) Int. Cl.
 H10F 19/75 (2025.01)
 H10F 19/90 (2025.01)
(52) U.S. Cl.
 CPC ........... H10F 19/75 (2025.01); H10F 19/908 (2025.01)
(58) Field of Classification Search
 CPC ........ H10F 19/70; H10F 19/75; H10F 19/902; H10F 19/904; H10F 19/908
 See application file for complete search history.

(56) References Cited

U.S. PATENT DOCUMENTS

| | | | | |
|---|---|---|---|---|
| 7,592,276 B2 * | 9/2009 | Hill | ...................... | D03D 15/258 |
| | | | | 313/511 |
| 2004/0244193 A1 * | 12/2004 | Jung | ...................... | H05K 3/363 |
| | | | | 439/495 |

(Continued)

FOREIGN PATENT DOCUMENTS

| | | | | | |
|---|---|---|---|---|---|
| CN | 104347746 A | * | 2/2015 | ............. | H10F 71/00 |
| DE | 4128766 A1 | * | 3/1993 | ............. | H10F 19/80 |

(Continued)

OTHER PUBLICATIONS

WO 2013/076794 A1 English Translation provided by FIT database, translated on Jan. 10, 2025.*

(Continued)

*Primary Examiner* — Golam Mowla
(74) *Attorney, Agent, or Firm* — Workman Nydegger

(57) ABSTRACT

A photovoltaic module includes at least one string of solar cells wherein the solar cells are electrically connected in series using a plurality of connecting elements, wherein each connecting element electrically connects a frontside of one of the solar cells of the at least one string with a backside of the neighboring solar cell of the at least one string; a weave of electrically insulating yarns on which the solar cells are positioned; at least one electronic device comprising a first terminal, and a second terminal, wherein the at least one electronic device is fixed to the weave and wherein the first terminal, and the second terminal are respectively electrically connected with the connecting elements at the backsides of neighboring solar cells of the at least one string.

15 Claims, 9 Drawing Sheets

(56)                    References Cited

U.S. PATENT DOCUMENTS

| | | | | |
|---|---|---|---|---|
| 2005/0272222 A1 * | 12/2005 | Flamand | ............. | H01L 21/2007 |
| | | | | 438/459 |
| 2010/0307557 A1 * | 12/2010 | Yamazaki | ............. | H10F 10/172 |
| | | | | 257/E31.113 |
| 2013/0327390 A1 * | 12/2013 | Borgers | ................ | H10F 19/908 |
| | | | | 438/98 |
| 2018/0090635 A1 * | 3/2018 | Borgers | ................. | H10F 19/80 |
| 2023/0299226 A1 * | 9/2023 | Meuris | ................. | H10F 19/906 |

FOREIGN PATENT DOCUMENTS

| | | | | | |
|---|---|---|---|---|---|
| EP | 2660878 | B1 | 12/2014 | | |
| EP | 3944342 | A1 | 1/2022 | | |
| WO | WO-2006123938 | A1 * | 11/2006 | ........... | H10F 19/908 |
| WO | WO-2009140521 | A2 * | 11/2009 | ........... | H10F 77/939 |
| WO | WO-2012026142 | A1 * | 3/2012 | ........... | H10F 77/147 |
| WO | WO-2013076794 | A1 * | 5/2013 | ............. | H10F 19/80 |
| WO | WO-2015140948 | A1 * | 9/2015 | ........... | H10F 77/147 |

OTHER PUBLICATIONS

Borgers, Tom et al., "Multi-wire interconnection technologies weaving the way for back contact and bifacial PV modules", 2017 IEEE 44th Photovoltaic Specialist Conference (PVSC), IEEE, Jun. 25, 2017, pp. 1-4.
Extended European Search Report from Corresponding European Patent Application No. EP23197552.5, Mar. 5, 2024.

* cited by examiner

Bypass
Diodes

Shaded Cell                    Junction Box

110

100

120

120

140

130

100
144b
110
144a
144b
140

100
160a
150a
130
140
150b
160b 140
147
144a
144b
143
Detail 148
110
143
146
120
148

143
Fig. 15
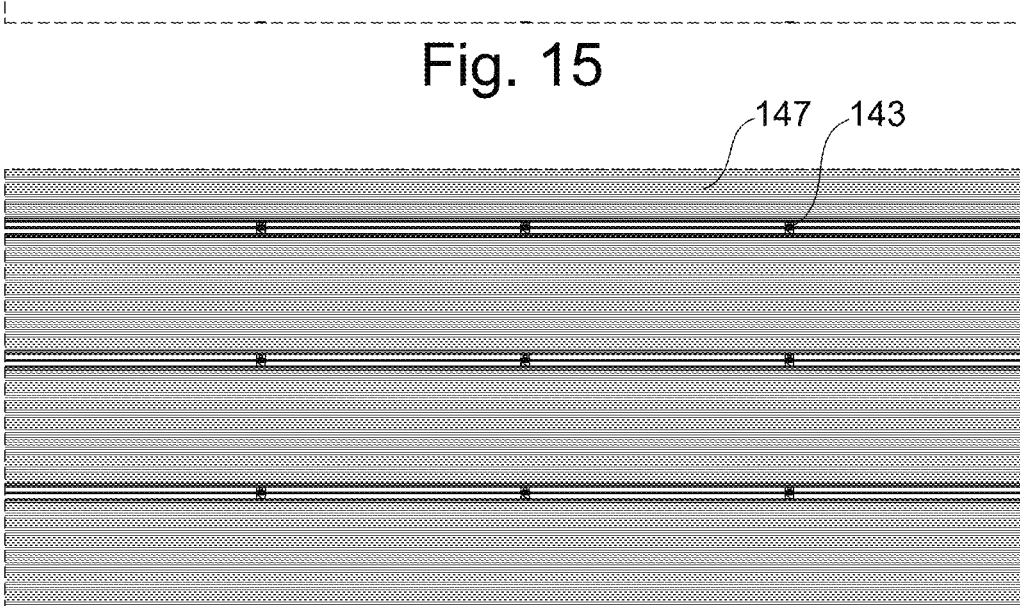
147  143
Fig. 16
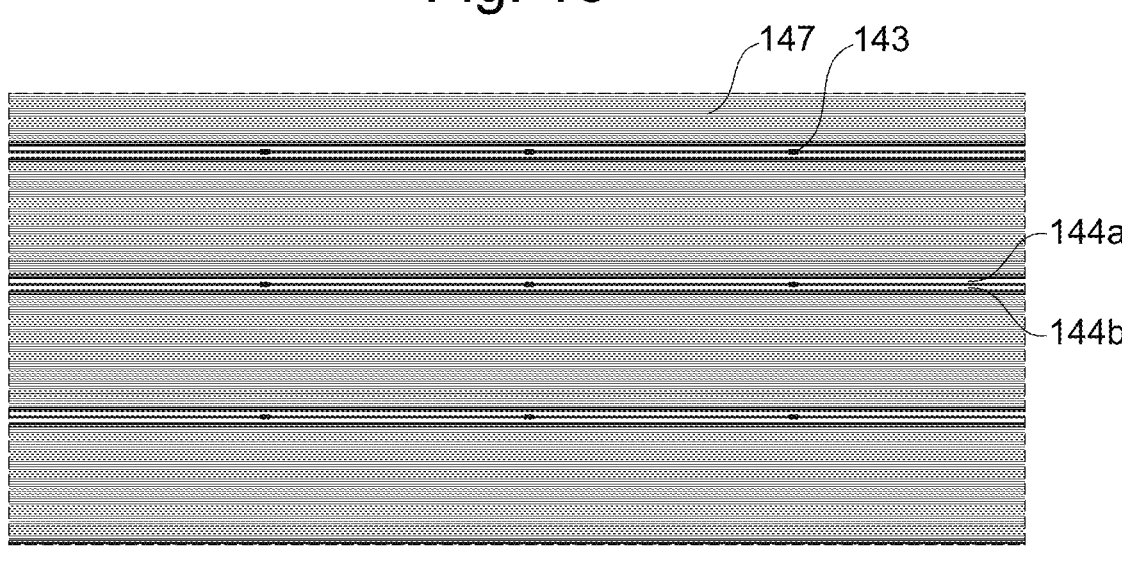
147  143
144a
144b
Fig. 17

TECHNICAL WEAVE FOR PHOTOVOLTAIC MODULES

FIELD OF THE INVENTION

The invention relates to the field of photovoltaic modules. More specifically it relates to the integration of electronic devices such as bypass diodes in a photovoltaic module and to the electrical connection of solar cell strings in a photovoltaic module.

BACKGROUND OF THE INVENTION

The integration of bypass diodes in a photovoltaic module is critical as it eliminates potential hot-spots which can damage photovoltaic cells and module during partial shading conditions of the module. Partial shading conditions may generate so-called hot-spots, which can damage photovoltaic cells and the module.

In order to reduce or eliminate hot-spots, bypass diodes are integrated in photovoltaic modules, usually placed on sub-strings of the solar cell strings. An example thereof is shown in FIG. 1. A solar cell string is defined as a series connection of individual solar cells. One diode is usually placed per up to 20 photovoltaic cells. The bypass diodes are typically connected in the junction box at the back side of the module, or at the edge of the module. The sub-strings are connected at both edges of the photovoltaic module by larger electrical conductors to reduce resistive losses. All these processes are largely done manually, or with limited automation potential.

This technology requires lead-out conductors, embedded in the module, to the external location in the junction boxes. As a result, adding more diodes to reduce losses when a substring is only partially shaded, would require additional lead-out conductors, adding complexity and cost.

To overcome this, experiments are performed to add more diodes between cells in a cell string using tabbing. However, these experimental exercises are difficult to upscale to, and implement in a large-scale production process, and/or are very costly.

There is, therefore, a need for photovoltaic modules and methods to obtain them, whereby the number of integrated bypass diodes can be increased. Preferably this should be possible in series- and parallel interconnections of prefabricated solar cell strings (e.g., from a tabber-stringer process). Preferably the automation potential of the production of solar cell modules should be increased.

SUMMARY OF THE INVENTION

It is an object of embodiments of the present invention to provide a photovoltaic module which comprises one or more electronic devices connected in parallel with one or more of the solar cells and it is an object of embodiments of the preset invention to provide an efficient method for providing such a photovoltaic module.

The above objective is accomplished by a method and device according to the present invention.

In a first aspect embodiments of the present invention relate to a photovoltaic module.

The photovoltaic module comprises at least one string of solar cells. The solar cells are electrically connected in series using a plurality of connecting elements. Each connecting element electrically connects a frontside of one of the solar cells of the at least one string with a backside of the neighboring solar cell of the at least one string, The photovoltaic module, moreover, comprises a weave of electrically insulating yarns on which the solar cells are positioned.

The photovoltaic module, moreover, comprises at least one electronic device comprising a first terminal, and a second terminal. The at least one electronic device is fixed to the weave and the first terminal is electrically connected with the connecting element at the backside of one solar cell and the second terminal is electrically connected with the connecting element at the backside of a neighboring solar cell of the at least one string.

It is an advantage of embodiments of the present invention that the at least one electronic device is connected in parallel with at least one of the solar cells. For example, in case of a first and a neighboring second solar cell this is achieved by connecting a first connecting element at the backside of the first solar cell with the first terminal of the electronic device and a second connecting element at the backside of the second solar cell with the second terminal of the electronic device wherein the second connecting element electrically connects the backside of the second solar cell with the frontside of the first solar cell. In that case the electronic device is in parallel with the first solar cell.

It is an advantage of embodiments of the present invention that this parallel connection with the solar cells can be achieved without having to increase the spacing between the solar cells or without having to add extra space at the sides of the solar cells.

It is an advantage of embodiments of the present invention that the weave is improving the correct positioning of the electronic devices.

In embodiments of the present invention the at least one electronic device is a diode connected such that it is forward biased when the solar cell to which it is connected in parallel is reverse biased.

It is an advantage of embodiments of the present invention that when a cell is shaded the current can pass through the diode which is in parallel with the cell.

In embodiments of the present invention the diode may for example be a Schottky diode.

In embodiments of the present invention the at least one diode comprises an integrated circuitry which is configured to limit heat dissipation during operation.

In embodiments of the present invention the photovoltaic module comprises a plurality of electronic devices which are connected with connecting elements of different neighboring solar cells of the at least one string.

It is an advantage of embodiments of the present invention that the number of electronic devices connected to a string of solar cells can be easily increased by integrating them in the weave.

The electronic devices may for example be bypass diodes. In that case it is an advantage of embodiments of the present invention that the efficiency of the photovoltaic module can be increased by increasing the number of bypass diodes in a string of solar cells. The electronic devices are not limited to bypass diodes. They may for example also be switches, electronic circuits such as DC/DC converters, passive components such as capacitors, etc.

In embodiments of the present invention pairs of first and second conductors are integrated in the weave. For a pair of neighboring solar cells with neighboring edges, the first conductor is present on one edge and is in contact with the connecting element at the backside of one solar cell and the second conductor is present on the other edge and is in contact with the connecting element at the backside of the other solar cell. The first terminal of the electronic device is in contact with the first conductor and the second terminal of the electronic device is in contact with the second conductor.

It is an advantage of embodiments of the present invention that the contacting between the electronic device and the connecting elements can be improved through better alignment and increased contact area.

In embodiments of the present invention the connecting elements comprise a plurality of parallel wires or ribbons.

It is an advantage of embodiments of the present invention that a good contact is achieved between the solar cells and the connecting elements. This is achieved by multiwire connecting elements. The plurality of parallel wires may be provided on a multiwire contact foil. The foil design may be such that the wires are not covered by the foil at the edges at the backsides of the solar cells.

It is an advantage of embodiments of the present invention that a terminal of an electronic device can be electrically connected to each of the plurality of wires or ribbons of a solar cells by means of a conductor (such as a conductive ribbon) integrated in the weave. This conductor may be an embossed (e.g. corrugated) or braided conductor that provides slack to overcome thermomechanical stress during thermal cycling.

In embodiments of the present invention the photovoltaic module comprises a plurality of strings which are positioned on the weave parallel with each other and aligned with each other.

In embodiments of the present invention the photovoltaic module comprises bussing conductors integrated in the weave at outer sides of the strings in order to create a series connection of the strings. Except for being at the outer sides of the strings they can be the same as the other conductors which can be used to potentially connect to each of the plurality of wires or ribbons of solar cells.

In embodiments of the present invention the pairs of first and second conductors are extending between the solar cells of the parallel strings.

In embodiments of the present invention the photovoltaic module comprises at least one inter-string electronic device fixed to the weave and connected with connecting elements at the backsides of neighboring solar cells in different strings.

In embodiments of the present invention the least one inter-string electronic device is a diode.

In a second aspect embodiments of the present invention relate to a method for producing a photovoltaic module.

The method comprises providing a string of solar cells wherein the solar cells are electrically connected in series using a plurality of connecting elements. Each connecting element electrically connects a frontside of one of the solar cells of the at least one string with a backside of the neighboring solar cell of the at least one string.

The method, furthermore, comprises weaving a weave of electrically insulating yarns. The method, furthermore, comprises fixing at least one electronic device to the weave. The electronic device comprises a first terminal and a second terminal.

The method, furthermore, comprises positioning the at least one string on the weave such that the at least one string is aligned with the at least one electronic device in the weave.

The method, furthermore, comprises electrically connecting the first terminal, and the second terminal of the at least one electronic device with the connecting elements at the backsides of neighboring solar cells of the at least one string.

It is an advantage of embodiments of the present invention that the weave can be combined with pre-soldered solar cell strings and that by combining the solar cell strings with the weave electronic devices can be put in parallel with the solar cells. It is advantageous that the stringing process should not be altered for adding the electronic devices. In a pre-soldered solar cell string connecting elements are already soldered or connected to the cells.

During the weaving pairs of first and second conductors are integrated in the weave such that they are accessible from one side of the weave to allow contacting with the connecting elements at the backsides of neighboring solar cells and such that they are accessible from a second opposite side of the weave to allow contacting the first and second terminal of the at least one electronic device.

During the fixing of the at least one electronic device the first terminal of the electronic device is connected with the first conductor and the second terminal of the electronic device is in connected with the second conductor.

During the positioning of the at least one string, the pairs of first and second conductors are aligned with pairs of neighboring edges of neighboring solar cells such that for each pair the first conductor is present on one edge and is in contact with the connecting element at the backside of one solar cell and the second conductor is present on the other edge and is in contact with the connecting element at the backside of the other solar cell.

In embodiments of the present invention bussing conductors are provided in the weave while weaving.

During the positioning, outer sides of the at least one string are aligned with the bussing conductors.

In embodiments of the present invention the conductors and, if present, the bussing conductors, are coated with a solder, and after positioning the at least one string, the connecting is achieved by heating the photovoltaic module thereby melting the solder.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIGS. 15-20 illustrate the different parts of a weave construction, from bottom to top, in accordance with embodiments of the present invention.

Figure 1:
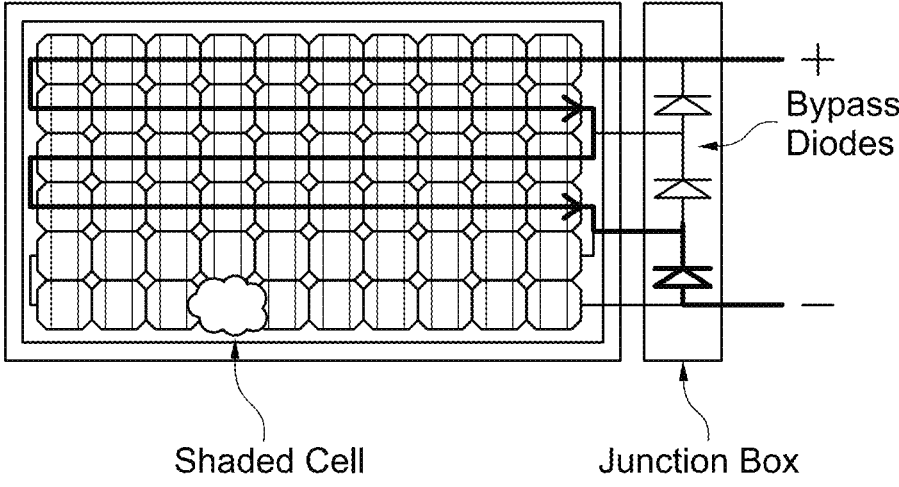
FIG. 1 shows a schematic drawing of a prior art photovoltaic module comprising a junction box with bypass diodes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention relates to solar cell strings wherein neighboring solar cells are connected front to back. This can be done in a traditional way using a tabber stringer process, in order to create the cell strings.

In a normal photovoltaic production process the strings of solar cells are laid upon a glass substrate and encapsulant material. Subsequently, the strings ends are connected with bussing ribbons by means of a solder process, in order to create a series connection of all the cell strings, and to provide suitable lead-out conductors to the junction box, for the bypass diode connection in the junction box and for the connection of leads.

Figure 2:
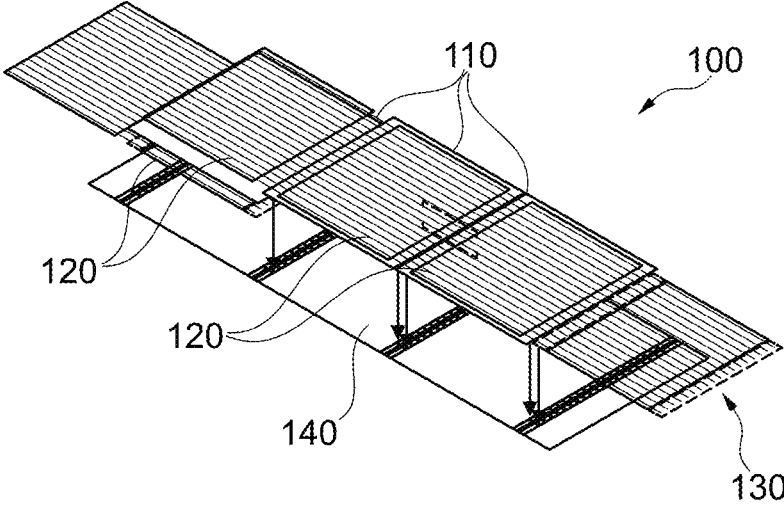
FIG. 2 shows a 3-D schematic drawing of a photovoltaic module in accordance with embodiments of the present invention.

In a first aspect embodiments of the present invention relate to a photovoltaic module comprising at least one string of solar cells. An example thereof is illustrated in the 3-D schematic drawing of FIG. 2 which shows a photovoltaic module 100 comprising a string 130 of solar cells 110. The drawing shows an exploded view of such a photovoltaic module.

In a string of solar cells, the solar cells 110 are electrically connected in series using a plurality of connecting elements 120. A connecting element can for example comprise a multiwire foil, or ribbons, or wires, or any other electrically conductive element connecting a frontside of one of the solar cells 110 of the at least one string 130 with a backside of the neighboring solar cell 110 of the at least one string 130. In the example illustrated in FIG. 2 the connecting elements 120 are multiwire foils. The part of the foils that is at the backside of the solar cells is adapted to allow electrical contact with the wires at the edge of the solar cells 110. In order to achieve this the wires are not covered by polymer foil at the edges of the solar cells for that part of the foil that is at the backside of the solar cell. This is indicated by the dashed lines at the right part of the string 130 of solar cells.

The photovoltaic module 100, moreover, comprises a weave 140 of electrically insulating yarns on which the solar cells are positioned. In embodiments of the present invention pre-assembled solar strings may be placed on the weave. Alternatively electrically conductive elements and solar cells are subsequently placed on the weave to create a cell string.

The photovoltaic module 100, moreover, comprises at least one electronic device 143. This electronic device is not visible in the drawing of FIG. 2 as it is located at the backside of the weave, but it is visible in FIG. 3 which shows a side view of the photovoltaic module. The at least one electronic device 143 comprises a first terminal 143a, and a second terminal 143b. The at least one electronic device is fixed to the weave 140 and the first terminal 143a, and the second terminal 143b are respectively electrically connected through the weave with the connecting elements at the backsides of neighboring solar cells of the at least one string 130.

The at least one electronic device may be fixed to the weave at a side opposite to the side where the solar cells are positioned. Alternatively the electronic device may be integrated in the weave.

It is an advantage of embodiments of the present invention that the at least one electronic device is connected in parallel with at least one of the solar cells and that this can be achieved without having to increase the space between the solar cells or without having to add extra space at the sides of the solar cells. It is an advantage of embodiments of the present invention that the technology allows the fabrication of more complex and shade-resistant photovoltaic modules. The technology, moreover, allows the configuration of shade-resistant modules with diverse electrical module architecture possibilities. Moreover, it adds the potential to improve the aesthetical quality, as well as the mechanical properties of the photovoltaic module. The aesthetical aspect can be improved by using colored yarns (e.g. patterns at the backside, black background between cells). Using reflective (e.g. coated with light reflective coating) or light confining (e.g. glass fiber) yarns might add to internal reflection in the module stack. It is, moreover, an advantage of embodiments of the present invention that the weave can add to the mechanical stability of the module. This can for example be achieved by using glass fibers as yarns for the weave. In embodiments of the present invention the yarns of the weave are made of weave material different from glass fiber, but with glass fiber integrated in the weave material to increase mechanical stability. In embodiments of the present invention the yarns may for example be coated glass fibers (e.g. coated with polymers). Other materials than glass fiber may also by used such as for example polymer-based yarns (like PE, PP, PET, . . . ), basalt yarn, or even natural yarns.

Figure 21:
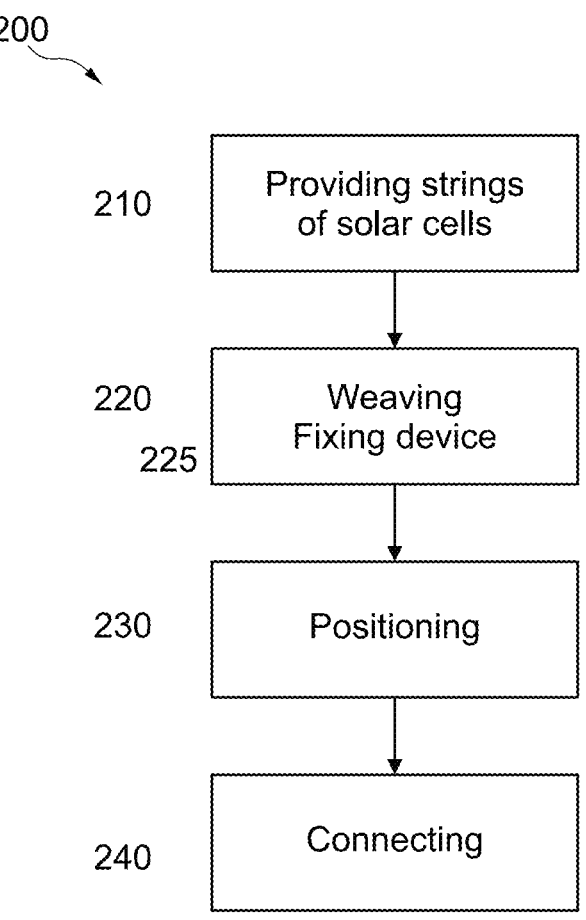
FIG. 21 shows an exemplary flow chart of a method in accordance with embodiments of the present invention.

In a second aspect embodiments of the present invention relate to a method 200 for producing a photovoltaic module. An example thereof is illustrated by the flowchart of FIG. 21.

The method comprises providing 210 a string 130 of solar cells 110. In this string the solar cells 110 are electrically connected in series using a plurality of connecting elements 120. Each connecting element 120 electrically connects a frontside of one of the solar cells 110 of the at least one string 130 with a backside of the neighboring solar cell 110 of the at least one string 130.

The method, moreover, comprises weaving 220 a weave 140 of electrically insulating yarns and fixing 225 at least one electronic device 143 comprising a first terminal 143a and a second terminal 143b to the weave 140. The at least one electronic device 143 may be fixed 225 after the weaving to the weave. Alternatively, the electronic devices may be fixed by integrating them during weaving in the weft direction of the weave (e.g. long strips with premounted electronic devices) and—if on a long tape or wire, on a bobbin—also in the warp direction of the weave.

The method, moreover, comprises positioning 230 the at least one string 130 on the weave 140 such that the at least one string 130 is aligned with the at least one electronic device 143 in the weave.

The method, moreover, comprises electrically connecting 240 the first terminal 143a, and the second terminal 143b of the at least one electronic device 143 with the connecting elements at the backsides of neighboring solar cells of the at least one string 130.

In embodiments of the present invention conductors 144a, 144b are integrated in the weave. The conductors may for example be Cu ribbons. The conductors may be coated with a low-temperature solder.

The conductors may be interwoven in such a way that they are accessible from the frontside of the weave to allow electrical contact with the connecting elements of the solar cell string at the backside of the string. In embodiments of the present invention the conductors are implemented to align at both ends of each solar cell in the string, perpendicular to the string orientation. Between the conductors in the weave, a specific area may be foreseen at the backside of the weave where two neighboring conductors of two neighboring solar cells in the solar cell string are accessible, and an electronic device element, such as a bypass diode can be placed. Since the conductors are in electrical contact with the connecting elements at the backsides of the neighboring cells only one electronic device is needed per cell for multiwire of multi-ribbon connecting elements. The invention is, however, not limited thereto. It is of course possible to add more than one electronic device in parallel with the cell. In embodiments of the present invention an electronic device may be connected in parallel with multiple cells. A bypass diode may for example be connected in parallel with two or more cells instead of one cell (also by connecting with non-neighboring cells). In order to connect with non-neighboring cell longer leads may be provided on a terminal of the bypass diode. The cells might also be small narrow strips (e.g. CIGS or Pk cells).

The conductors 144a, 144b may for example be electrically conductive ribbons. An example thereof is illustrated in the schematic drawing of FIG. 3 which shows a schematic exploded view of side view of a photovoltaic module 100 in accordance with embodiments of the present invention. The conductive ribbons may for example have a width of 0.8 to 4 mm or of 2 to 2.5 mm. They may for example have a thickness between 40 to 200 μm or even between 120 and 150 μm. The electronic device 143 is, in this example, a diode which is connected such that it acts as a bypass diode. It is, therefore, connected in parallel with the solar cell oriented such that it is reverse biased when the solar cell 110a to which it is connected in parallel is generating current and forward biased when the solar cell to which it is connected in parallel is reverse biased. In this example a cross-sectional view through the solar cells, conductors and bypass diode is shown. The cross-section is taken along the weft. The connecting elements 120 may for example be multiwire polymer foils. Also other types of conductors and other types of connecting elements may be used. The bypass diodes can be Schottky diodes, switches or more complex integrated circuits that have a diode functionality to limit heat dissipation during operation.

A diode can for example have a thickness between 0.5 and 0.9 mm, for example 0.7 mm. The size of a diode may for example be 6 by 8 mm. The invention is, however, not limited thereto.

Solar cells may for example have a size of 182 mm by 182 mm (M10 format). In embodiments of the present invention also half cells may be used. These may for example have a size of 182 mm by 91 mm. Also other formats such as MO (156×156 mm), M2 (156.75×156.75 mm), G1 (158.75× 158.75 mm), M4 (161.70×161.70 mm), M6 (166×166 mm), M12 (210×210 mm), M12+ (217×217 mm) are possible. The invention is not limited to these sizes. The invention is applicable to evolving formats of solar cells. The invention is also applicable to smaller solar cells. To limit current density, cells may for example be cut in half or three or four pieces. The accuracy on the cell size is depending on the cutting, but is often +/−0.5 mm.

In embodiments of the present invention a spacing may be present between the solar cells. The spacing is measured in a direction of the connecting elements orthogonal to the edges of the cells and in a surface parallel with the frontside or backside of the solar cells. The spacing between solar cells may for example be 2 mm or smaller. The minimum spacing may for example be 1 mm. The minimum spacing should allow that the connecting elements (e.g. stringing ribbons or wires) can pass through the spacing. The thickness of the stringing ribbons or wires depends on the current density. It may for example range between 40 and 400 μm or even between 100 and 180 μm (for example in the case of stringing ribbons). The thickness of multiwire foils may for example range between 200 and 300 μm. For stringing ribbons it may for example be in the range of 100-180 μm.

Alternatively there may be no spacing between the solar cells, measured in the direction of the connecting elements orthogonal to the edges of the cells and in a surface parallel with the frontside or backside of the solar cells, or the solar cells may even be overlapping. In that case the frontside of one solar cell is aligned with the backside of the neighboring solar cell such that the connecting elements are not bent between the cells. In case of overlapping solar cells, the connecting elements pass between the solar cells.

The first and second terminals 143a, 143b may for example be contact pads. They are located on the same side of the device. Having the contact pads on the same side of the device has the advantage that the device can be easily brought in contact with the conductors 144a, 144b. In the example illustrated in FIG. 3 the polymer of the multiwire foil is locally removed to allow good contact between the connecting elements 120 and the conductors 144. In this exemplary embodiment of the present invention, wherein a multiwire foil is used as a connecting element, the thickness of the diode (e.g. 0.7 mm) is partly compensated by the thickness of the polymer foil of the connecting element 120 and the thickness of the weave. In embodiments of the present invention where multiwire foils are used as connecting elements, the diode may be positioned between the wires of the multiwire foil. In embodiments of the present invention the protective potting agent of the diode package is not necessarily required. It is for example not needed if the photovoltaic module is sufficiently sealed. This allows to save on materials and thickness.

Figure 3:
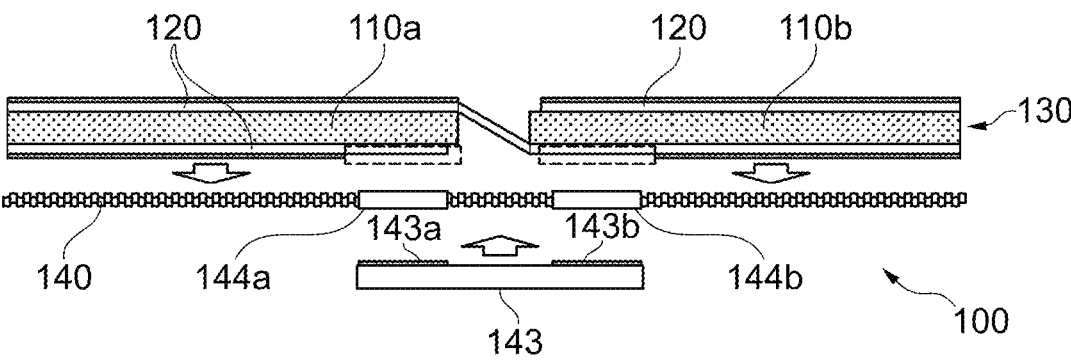
FIG. 3 shows a 2-D schematic exploded view of a photovoltaic module in accordance with embodiments of the present invention.
Figure 4:
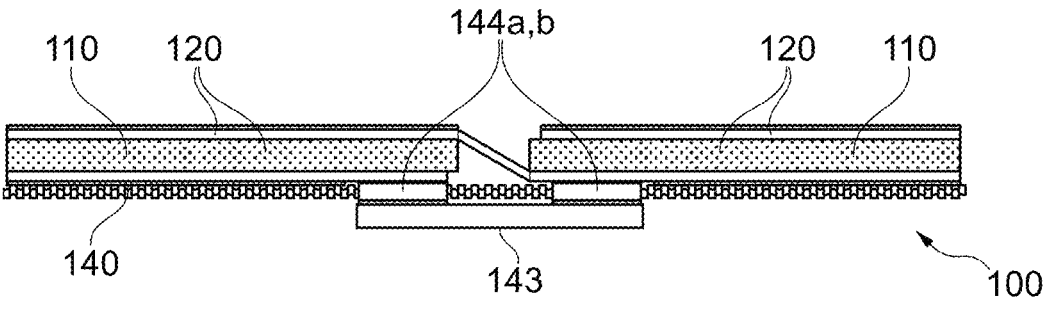
FIG. 4 shows the same photovoltaic module as FIG. 3, but with all elements assembled together.

FIG. 4 shows the same photovoltaic module as the module in FIG. 3 but with the terminals of the electronic device 143 in contact with the conductors 144a, 144b and with the conductors 144a, 144b in contact with the connecting elements 120.

Figure 5:
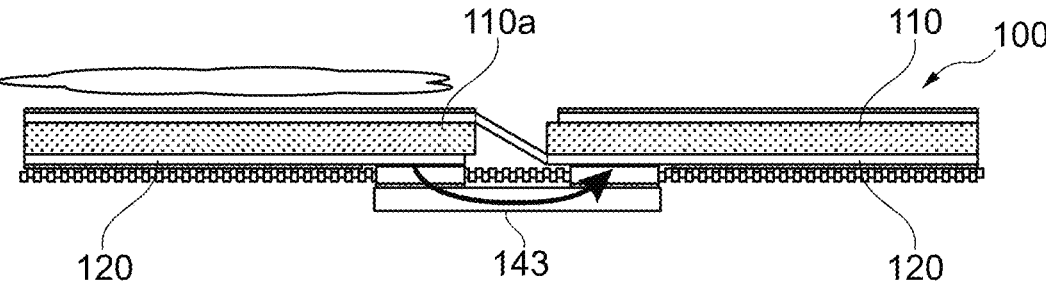
FIG. 5 illustrates how a shadowed cell is bypassed in a photovoltaic module in accordance with embodiments of the present invention.

FIG. 5 shows the same photovoltaic module as in FIG. 3 and FIG. 4. The bypass diode 143 is in parallel with the left solar cell 110a. If this cell 110a is shadowed the bypass diode 143 is activated and the cell is bypassed from the bottom connecting element 120 of the shadowed cell to the bottom connecting element 120 of the neighboring cell.

In embodiments of the present invention during the weaving 220 pairs of first and second conductors 144a, 144b are integrated in the weave 140 such that they are accessible from one side of the weave to allow contacting with the connecting elements at the backsides of the neighboring solar cells and such that they are accessible from a second opposite side of the weave to allow contacting the first 143a and second 143b terminal of the electronic device.

The electronic device 143 may be fixed to the weave by connecting the first terminal 143a of the electronic device with the first conductor 114a and the second terminal 143b of the electronic device is in connected with the second conductor 144b.

During the positioning 230 of the at least one string, the pairs of first and second conductors 144a, 144b are aligned with pairs of neighboring edges of neighboring solar cells 110 such that for each pair the first conductor 144a is present on one edge and is in contact with the connecting element at the backside of one solar cell and the second conductor 144b is present on the other edge and is in contact with the connecting element at the backside of the other solar cell.

Connecting the cells with the underlying conductors and connecting the terminals of the electronic device with the conductors may be achieved by soldering. This may for example be done during the lamination process of the photovoltaic module. A low-temperature solder may be used with a melting temperature that is lower than or equal to the lamination temperature.

Figure 6:
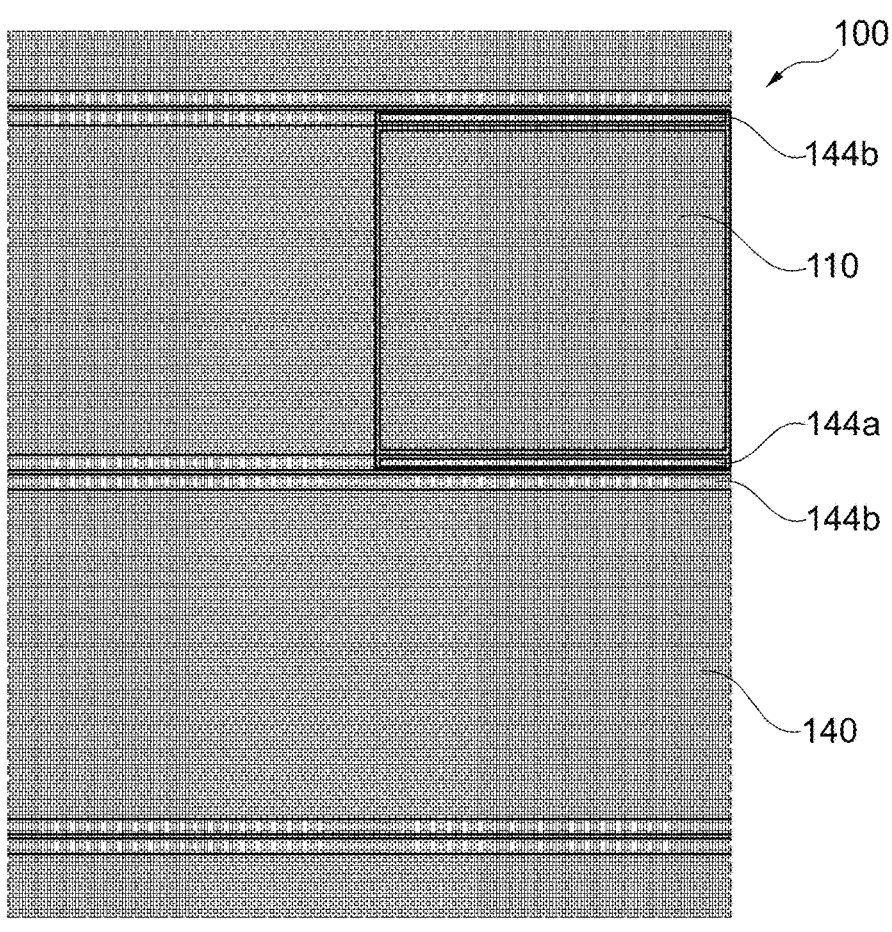
FIG. 6 shows a weave with conductors integrated in the weave for a photovoltaic module in accordance with embodiments of the present invention.

FIG. 6 shows a weave 140 with conductors 144a, 144b integrated in the weave. In FIG. 6 an area is marked where a cell 110 can be positioned on the weave such that the edges of the cell are aligned with the conductors 144a, 144b. The conductors 144a, 144b are woven such that they can make electrical contact with the connecting elements 120 at the backside of the solar cell. The conductors 144a, 144b are, moreover, woven such that at the backside of the weave electronic devices can be electrically connected with the conductors 144a, 144b.

Figure 7:
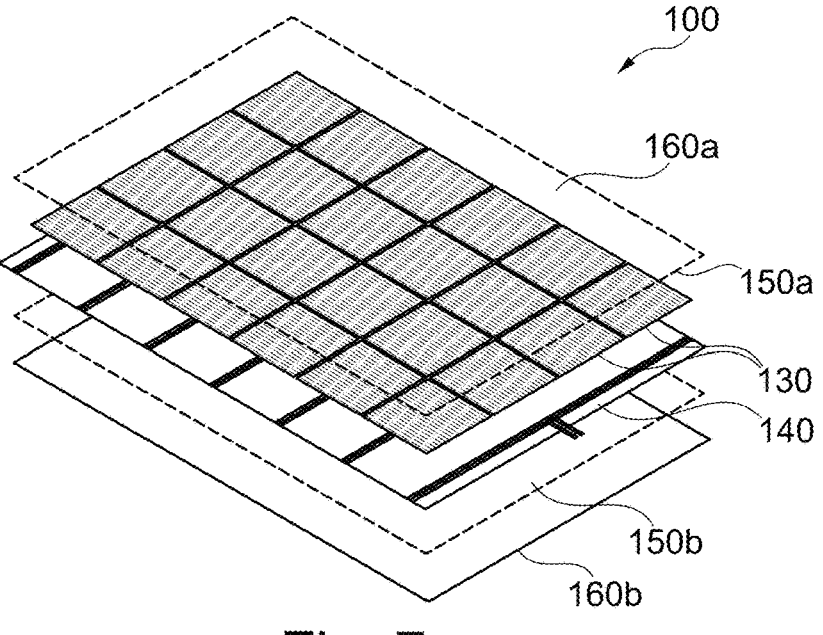
FIG. 7 shows an exemplary stack of a photovoltaic module in accordance with embodiments of the present invention.

In embodiments of the present invention the weave is applied as an additional layer during module fabrication in the lay-up step of the module stack before lamination. An example of stack of a photovoltaic module in accordance with embodiments of the present invention is shown in FIG. 7. From top to bottom the following layers are shown: a glass sheet 160a, an encapsulant 150a, strings 130 of solar cells, an interconnection weave 140, an encapsulant 150b, and a glass sheet 160b. After alignment and placement of the strings 130 on the weave 140, the stack is completed by an encapsulant layer 150a, 150b on both sides, and a front-160a and backsheet 160b.

The weave 140 allows several electrical configurations of the cell string interconnection. For example, an electrical series connection can be obtained by cutting (interrupting) the conductors 144 in specific areas. Parallel connection of cell strings can be obtained without cutting (interrupting) the conductors 144. In such embodiments, when a cell is shaded, the current can be redistributed through neighboring cells or cell strings. This means that the cells or cell strings can have a bypass functionality, such that the number of electronic devices (e.g. diodes) can be reduced or the placement of diodes may even be omitted.

Electronic devices (e.g. bypass diodes) may be positioned parallel with cells in a cell string. It is an advantage of the present invention that it even allows to put one electronic device in parallel with every cell in a cell string. It is an advantage of embodiments of the present invention that the electronic devices (e.g. bypass diodes) can be added to (pre-fabricated) cell strings without changing the connecting elements (e.g. the tabbing/stringing, the multiwire foil stringing), or lay-up process.

The weave 140 also allows to add an electronic device (e.g. diode) between 2 cell strings or between two adjacent cells of 2 neighboring cell strings. It for example enables parallel interconnection of neighboring individual cells in neighboring cell strings.

The weave 140 also allows to introduce a series-parallel electrical connection of cells in a string with cells in the neighboring string, by not cutting the weave conductors between two cell strings having the same polarity orientation.

The weave 140 also allows to introduce a series connection of the end cell in a string with the first cell of a neighboring string, using multiple conductors of the weave for lower resistive losses, by interrupting conductors in the weave, except for those running under the end cells of two neighboring strings. Since a method according to embodiments of the present invention enables cell string bussing, it is advantageous that no additional bussing steps are needed during module fabrication.

Figure 8:
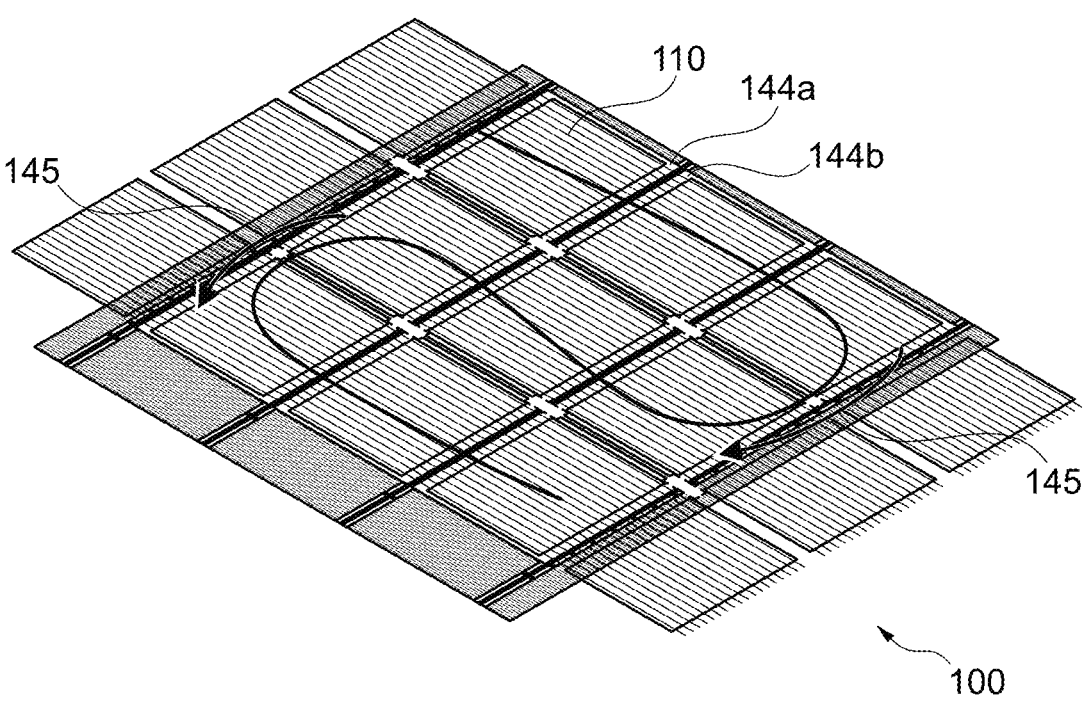
FIG. 8 shows how strings of solar cells are connected in series by means of a weave of a photovoltaic module in accordance with embodiments of the present invention.

FIG. 8 shows how the conductors 144a, 144b between the strings of solar cells are interrupted for series connection of cell strings. At the outer ends of the strings only one conductor is interrupted. The other conductor is used as bussing conductor 145 in order to create a series connection of the strings. Interrupting of the conductors may for example be done by laser cutting or punching.

Figure 9:
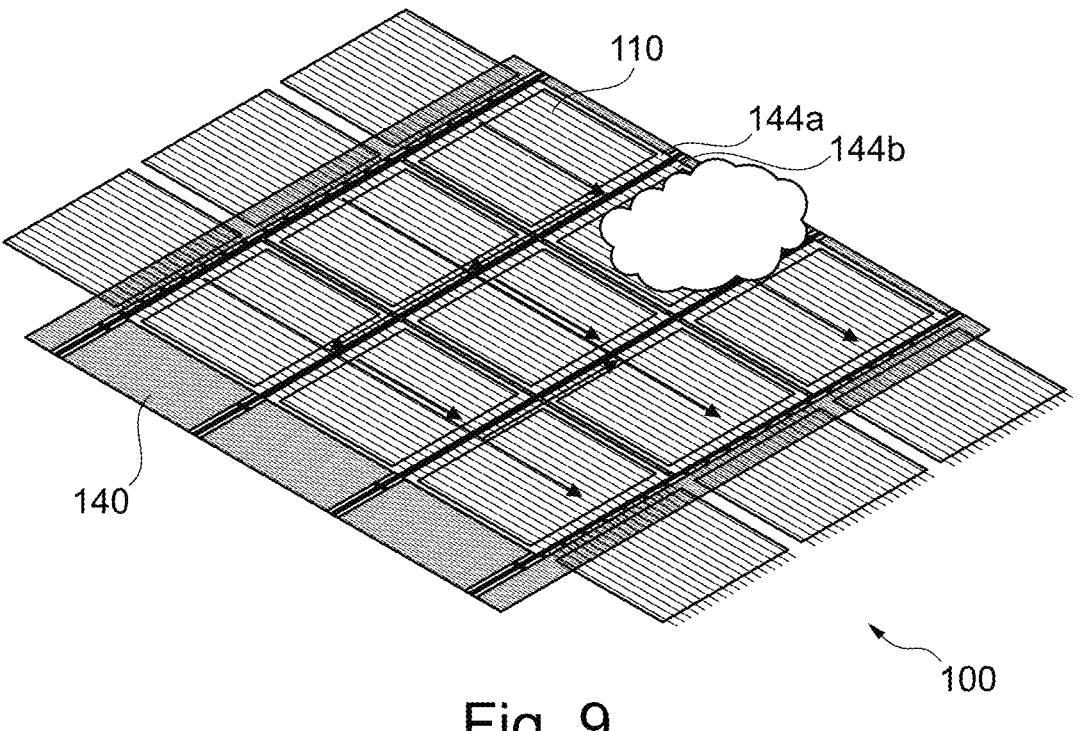
FIG. 9 shows how strings of solar cells are connected in parallel by means of a weave of a photovoltaic module in accordance with embodiments of the present invention.

Another possible configuration of a photovoltaic module in accordance with embodiments of the present invention is illustrated in FIG. 9. This figure shows a plurality of parallel solar cell strings on a weave. The solar cell strings are aligned with the conductors 144a, 144b of the weave. In this configuration the conductors are not cut between the parallel strings. As a result thereof current before a shaded cell in a cell string is redistributed to the nearby strings. This configuration is combined with one or more electronic devices which are connected in parallel with at least one or more solar cells, in accordance with embodiments of the present invention. It is an advantage of this configuration that the number of electronic devices in parallel with the solar cells can be reduced.

Figure 10:
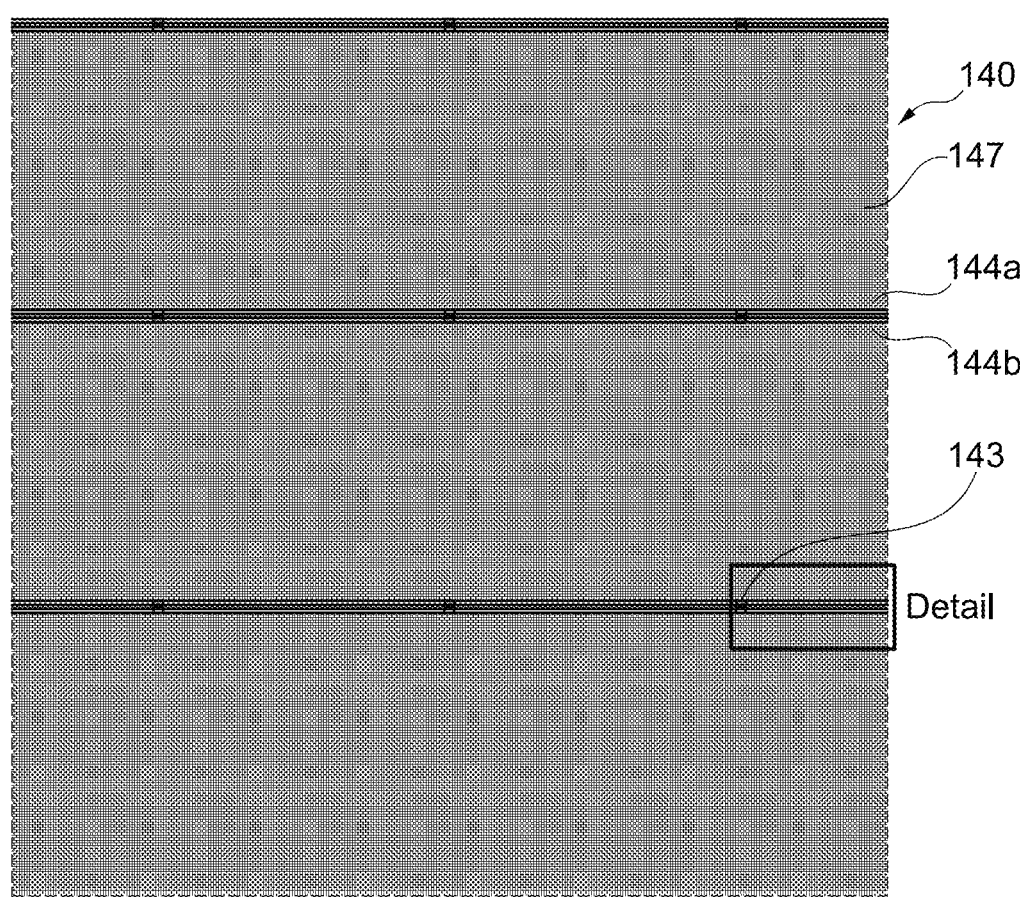
FIG. 10 shows an example of a weave of a photovoltaic module in accordance with embodiments of the present invention.

The conductors 144a, 144b may be implemented in the warp of the loom to allow good alignment, together with the warp yarns of the weave. FIG. 10 shows an example of such a weave 140. In this example no cells are positioned on the weave yet. The conductors 144a, 144b and the warp yarns 147 are oriented horizontally. A detail of the weave 140 with solar cells 110 aligned on the weave 100 is shown in FIG.

11. In this drawing the vertical yarns extending from under the solar cells 110 are the weft yarns 148. There may for example be between 4 and 8 weft yarns per cm, for example 6 weft yarns per cm. The electronic devices 143 are also shown. They are positioned within a string and are therefore referred to as intra-string electronic devices. The connecting elements 120 in this example are multi-wire cell string interconnects.

Figure 11:
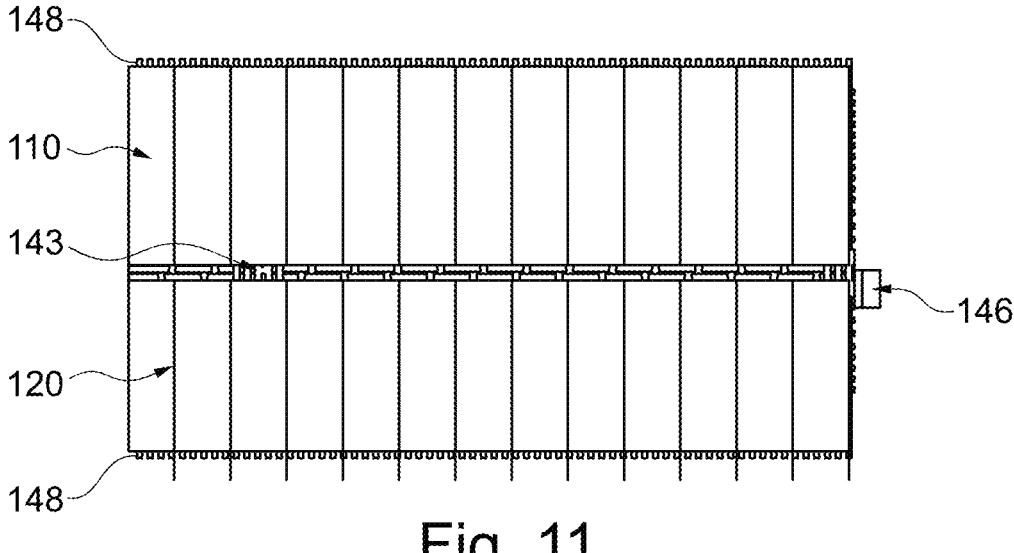
FIG. 11 shows a detail of a weave with solar cells aligned on the weave of a photovoltaic module in accordance with embodiments of the present invention.

In embodiments of the present invention the photovoltaic module also may comprise one or more inter-string electronic devices 146. These are fixed to the weave and connected with connecting elements at the backsides of neighboring solar cells in different strings 130. An example of such an inter-string electronic device 146 is also shown in FIG. 11. One of its terminals is connected to a solar cell of one string. The other terminal is free to be connected with another solar cell of another string (not shown in this figure) parallel with the shown string. This inter-string electronic device can for example be a blocking diode (to prevent that current would flow in an undesired way), or a diode to allow bypassing a part of a string (e.g. in case the strings are oriented in series). The invention is, however, not limited thereto. Also other configurations or electronic devices in these configurations may be considered.

Figure 12:
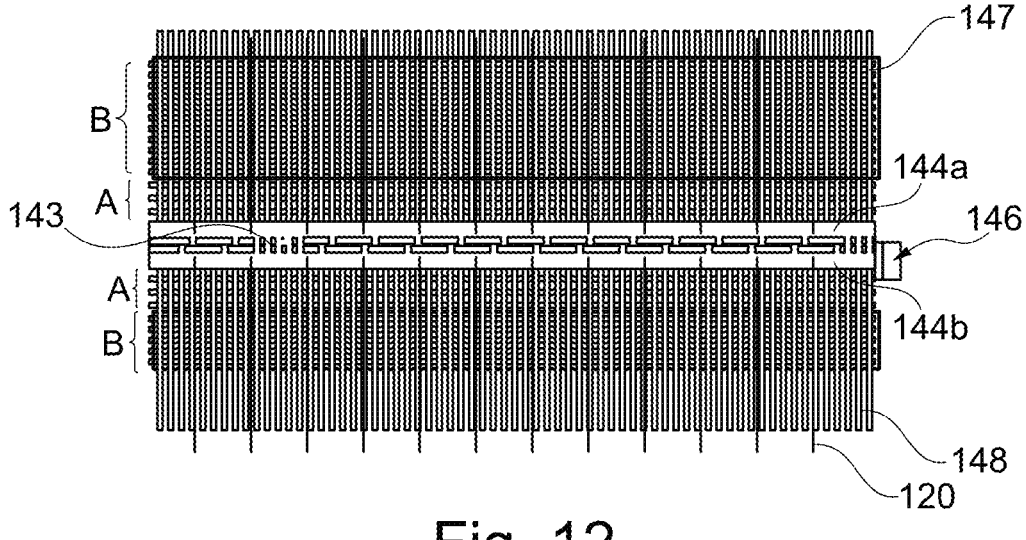
FIG. 12 shows a top side view of a detail of the weave without showing the cells of a photovoltaic module in accordance with embodiments of the present invention.

In FIG. 12 shows a top side view of a detail of the weave without showing the cells. The connecting elements 120 are still shown to illustrate the alignment between the weave and the connecting elements. The warp yarns 147 and the first and second conductors 144a, 144b are parallel with each other. Also the weft yarns 148 are shown in the figure. The weft yarns are woven such that the conductors 144a, 144b are accessible from the top side (the side between the solar cells and the weave) such that the first conductor can be connected with connecting elements at the backside of a first solar cell and the second conductor can be connected with connecting elements at the backside of a second solar cell which is neighboring the first solar cell. At the position of the electronic device 143 and the inter-string electronic device 146 the weft yarns are at the top side of the weave such that the electronic devices can be connected at the bottom side to the conductors. The density of the warp yarns may vary from zone to zone. Different weave styles may be possible. For example plain, twill, LENO. Also other variations and combinations thereof are possible. In zones A, indicated in FIG. 12, the warp yarns may have a density of 10 yarns/cm. The weave density is related to the yarn thickness, and is also determining the cost, density (opacity), thickness, aesthetics of the weave. In zones A, LENO weave may be applied. This may for example be done for the 3 warp yarns closest to the conductors, at both sides of the conductors. In zones B, indicated in FIG. 12, the warp yarns may for example have a density of 6 yarns/cm.

Figure 13:
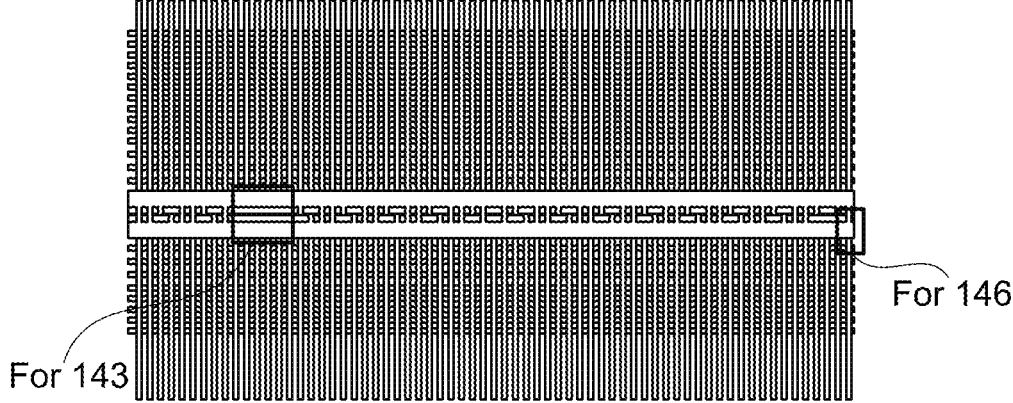
FIG. 13 shows a backside of a detail of a weave without electronic devices of a photovoltaic module in accordance with embodiments of the present invention.

This is illustrated in FIG. 13 which shows a backside of a detail of the weave without electronic devices. At the open positions the electronic devices 143, 146 can be connected to the conductors.

Figure 14:
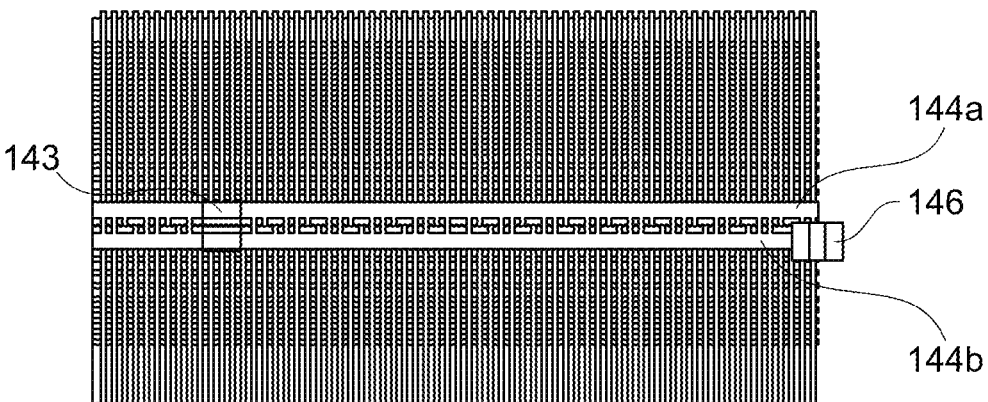
FIG. 14 shows a backside of a weave with cells at the frontside of a photovoltaic module in accordance with embodiments of the present invention.

This is illustrated in FIG. 14, which shows the backside of the weave with cells at the frontside. In this figure a bypass diode 143 is connected to the conductors 144a, 144b and an inter-string electronic device 146 is connected to conductor 144b.

The yarns may be selected for having a low moisture absorption. The yarns may be selected such that their melting temperature is higher than the melting temperature of the lamination. A temperature of higher than 140-150° C. may for example be selected. The yarns may have a melting temperature lower than the melting temperature of the lamination. The yarns keep the interwoven conductors aligned during string lay-up and/or diode placement. Having yarns with a melting temperature lower than the melting temperature of the lamination may be advantageous because they may tack on the connecting elements after pre-heating to avoid misalignment of the connecting elements during handling after placement of the connecting elements, or the electronic devices. The yarns may comprise inert materials such as polymers filled with glass fibers or basalt fibers. They may comprise thermoplastics such as polypropylene, polyethene, polyethylene terephthalate. The invention is, however, not limited thereto.

In embodiments of the present invention the yarns may comprise a thermoplastic coating. This allows to melt the knots (i.e. the crossing of 2 wires in warp and weft) after weaving. In such embodiments mineral yarns may be used. In embodiments of the present invention the yarns may be textured which gives more possibility for achieving a thin but covering weave.

In embodiments of the present invention one or more LEDs may be added to the photovoltaic module. For LEDs additional conductors are added in the warp and weft directions. LEDs are then placed at the cross points of these conductors, with a warp conductor having a different polarity than the weft one. Possible also a third warp or weft conductor may be added for signal driving.

In embodiments of the present invention colored patterns can be achieved by using differently colored yarns in the warp direction and/or in the weft direction, or by color printing on the weave.

As discussed earlier, in embodiments of the present invention an electronic device may be connected in parallel with a single cell.

Additionally, in embodiments of the present invention one electronic device may be electrically connected in parallel with multiple cells. This may for example be obtained when neighboring cell strings are similarly oriented (with same polarities at string ends), and when ribbons in the interconnection weave are not interrupted between the cell strings. Adding one or more electronic devices between two cell rows results in that case in bypassing a whole cell row.

Besides the two earlier cases, in embodiments of the present invention multiple electronic devices may be electrically connected in parallel with a single cell.

FIGS. 15-20 illustrate the different parts of a weave construction, from bottom to top, in accordance with embodiments of the present invention.

FIG. 15 shows a topology of a plurality of electronic devices 143.

FIG. 16 shows the warp yarns 147 and the electronic devices 143. These are the horizontal yarns in this figure.

FIG. 17 additionally shows the conductors 144a, 144b parallel with the warp yarns 147.

Figure 18:
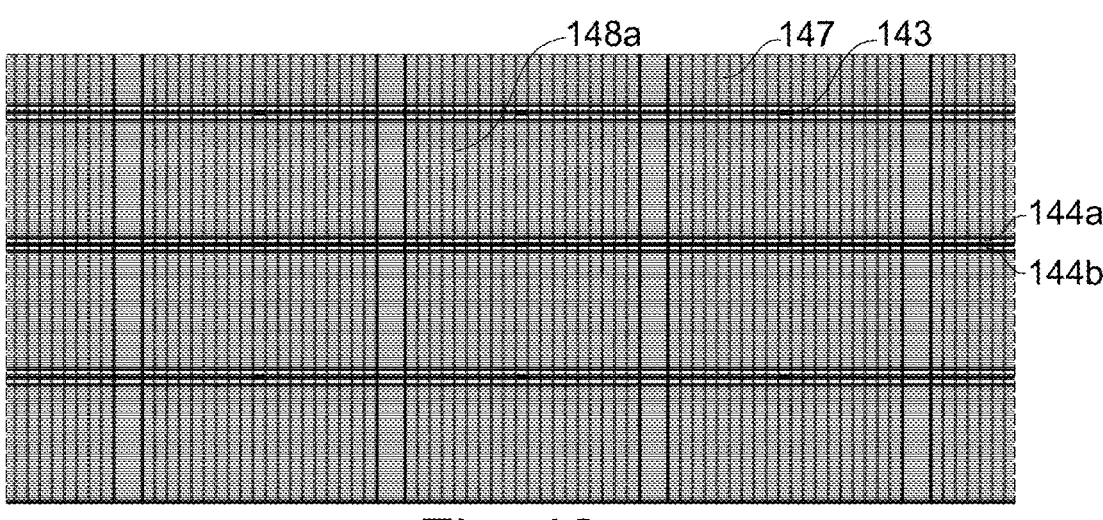

FIG. 18 additionally shows weft yarns 148a crossing under the conductors. The weft yarns are the vertical yarns in this and the following figure.

Figure 19:
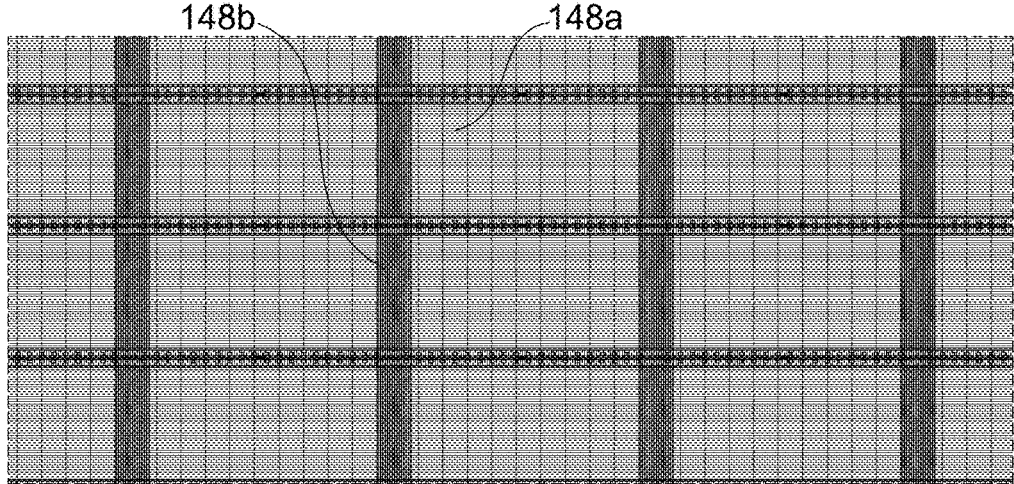

FIG. 19 additionally shows weft yarns 148b crossing over the conductors.

Figure 20:
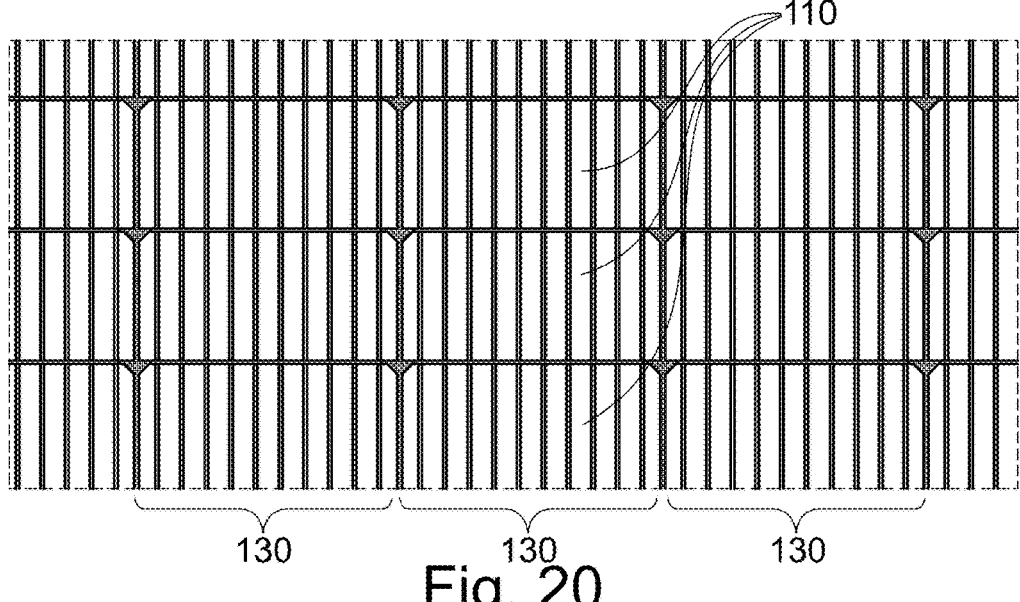

FIG. 20 shows a weave with on top thereof cell strings 130. In the example shown the cells 110 are connected in cell strings using multiwire foils (in this example 10 wires/foil). The cells are half cut cells.

The invention claimed is:

1. A photovoltaic module, the photovoltaic module comprising
at least one string of solar cells wherein the solar cells are electrically connected in series using a plurality of connecting elements, wherein each connecting element electrically connects a frontside of one of the solar cells of the at least one string with a backside of the neighboring solar cell of the at least one string,
a weave of electrically insulating yarns on which the solar cells are positioned,
at least one electronic device comprising a first terminal, and a second terminal, wherein the at least one electronic device is fixed to the weave and wherein the first terminal, and the second terminal are respectively electrically connected with the connecting elements at the backsides of neighboring solar cells of the at least one string.

2. The photovoltaic module according to claim 1, wherein the at least one electronic device is a diode connected such that it is forward biased when the solar cell to which it is connected in parallel is reverse biased.

3. The photovoltaic module according to claim 2, wherein the at least one diode comprises an integrated circuitry which is configured to limit heat dissipation during operation.

4. The photovoltaic module according to claim 1, comprising a plurality of the electronic devices such that the plurality of the electronic devices is connected with connecting elements of different neighboring solar cells of the at least one string.

5. The photovoltaic module according to claim 1, wherein pairs of first and second conductors are integrated in the weave wherein for a pair of neighboring solar cells with neighboring edges, the first conductor is present on one edge and is in contact with the connecting element at the backside of one solar cell and the second conductor is present on the other edge and is in contact with the connecting element at the backside of the other solar cell and wherein the first terminal of the electronic device is in contact with the first conductor and the second terminal of the electronic device is in contact with the second conductor.

6. The photovoltaic module according to claim 1, wherein the connecting elements comprise a plurality of parallel wires or ribbons.

7. The photovoltaic module according to claim 5, comprising a plurality of strings which are positioned on the weave parallel with each other and aligned with each other.

8. The photovoltaic module according to claim 7, comprising bussing conductors integrated in the weave at outer sides of the strings in order to create a series connection of the strings.

9. The photovoltaic module according to claim 7, wherein the pairs of first and second conductors are extending between the solar cells of the parallel strings.

10. The photovoltaic module according to claim 7, comprising at least one inter-string electronic device fixed to the weave and connected with connecting elements at the backsides of neighboring solar cells in different strings.

11. The photovoltaic module according to claim 10, wherein the least one inter-string electronic device is a diode.

12. A method for producing a photovoltaic module, the method comprising:
providing a string of solar cells wherein the solar cells are electrically connected in series using a plurality of connecting elements such that each connecting element electrically connects a frontside of one of the solar cells of the at least one string with a backside of the neighboring solar cell of the at least one string,
weaving a weave of electrically insulating yarns, fixing at least one electronic device comprising a first terminal and a second terminal to the weave, positioning the at least one string on the weave such that the at least one string is aligned with the at least one electronic device in the weave, electrically connecting the first terminal, and the second terminal of the at least one electronic device with the connecting elements at the backsides of neighboring solar cells of the at least one string.

13. The method according to claim 12, wherein during the weaving pairs of first and second conductors are integrated in the weave such that they are accessible from one side of the weave to allow contacting with the connecting elements at the backsides of neighboring solar cells and such that they are accessible from a second opposite side of the weave to allow contacting the first and second terminal of the electronic device, and wherein during the fixing the first terminal of the electronic device is connected with the first conductor and the second terminal of the electronic device is in connected with the second conductor during the positioning of the at least one string, the pairs of first and second conductors are aligned with pairs of neighboring edges of neighboring solar cells such that for each pair the first conductor is present on one edge and is in contact with the connecting element at the backside of one solar cell and the second conductor is present on the other edge and is in contact with the connecting element at the backside of the other solar cell.

14. The method according to claim 12, wherein during the weaving bussing conductors are provided in the weave, and wherein during the positioning outer sides of the at least one string are aligned with the bussing conductors.

15. The method according to claim 12, wherein the conductors and, if present, the bussing conductors, are coated with a solder, and wherein after positioning the at least one string, the connecting is achieved by heating the photovoltaic module thereby melting the solder.

* * * * *